United States Patent
Masuda

(10) Patent No.: US 12,356,736 B2
(45) Date of Patent: Jul. 8, 2025

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Yoshiaki Masuda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 316 days.

(21) Appl. No.: 17/798,645

(22) PCT Filed: Jan. 7, 2021

(86) PCT No.: PCT/JP2021/000381
§ 371 (c)(1),
(2) Date: Aug. 10, 2022

(87) PCT Pub. No.: WO2021/176839
PCT Pub. Date: Sep. 10, 2021

(65) Prior Publication Data
US 2023/0057090 A1    Feb. 23, 2023

(30) Foreign Application Priority Data
Mar. 6, 2020   (JP) ................. 2020-038455

(51) Int. Cl.
| | |
|---|---|
| H04N 25/76 | (2023.01) |
| H10F 39/00 | (2025.01) |
| H10F 39/18 | (2025.01) |

(52) U.S. Cl.
CPC ........... *H10F 39/182* (2025.01); *H04N 25/76* (2023.01); *H10F 39/184* (2025.01); *H10F 39/8067* (2025.01)

(58) Field of Classification Search
CPC ......... H01L 27/14612; H01L 27/14629; H01L 27/14645; H01L 27/14649; H01L 27/14654; H04N 25/76
See application file for complete search history.

(56) References Cited

U.S. PATENT DOCUMENTS

| | | |
|---|---|---|
| 2008/0036022 A1 | 2/2008 | Hwang et al. |
| 2015/0228689 A1 | 8/2015 | Lenchenkov |

(Continued)

FOREIGN PATENT DOCUMENTS

| | | |
|---|---|---|
| JP | 2006-261372 | 9/2006 |
| JP | 2016-001633 | 1/2016 |

(Continued)

OTHER PUBLICATIONS

International Search Report and Written Opinion prepared by the Japan Patent Office on Mar. 18, 2021, for International Application No. PCT/JP2021/000381, 3 pgs.

*Primary Examiner* — Kevin K Pyo
(74) *Attorney, Agent, or Firm* — Sheridan Ross PC

(57) ABSTRACT

Provided is a solid-state imaging device capable of improving sensitivity of near-infrared wavelengths and suppressing color mixing without being restricted by a wiring layout. A solid-state imaging device includes: a substrate on which a plurality of photoelectric conversion units are formed corresponding to different light wavelengths; a wiring layer including a transistor on a surface opposite to a surface on a light incident side of the substrate and on a photoelectric conversion unit side to execute signal processing on a charge output from the photoelectric conversion unit and a wiring on a side opposite to the photoelectric conversion unit side of the transistor to transfer an electrical signal obtained by the transistor; and a reflection design film on a transistor side from at least a junction between the substrate and the wiring (Continued)

layer, which has higher reflectivity than the wiring layer and reflects a vertical component of incident light.

19 Claims, 10 Drawing Sheets

(56) References Cited

U.S. PATENT DOCUMENTS

| | | | |
|---|---|---|---|
| 2017/0229503 A1 | 8/2017 | Suzuki | |
| 2018/0240847 A1* | 8/2018 | Ota | ............. H01L 27/14638 |
| 2019/0244992 A1 | 8/2019 | Yokogawa et al. | |
| 2020/0027913 A1 | 1/2020 | Nomura | |

FOREIGN PATENT DOCUMENTS

| | | |
|---|---|---|
| JP | 2016082133 A | 5/2016 |
| KR | 100745991 B1 | 8/2007 |
| KR | 20190067179 A | 6/2019 |
| WO | WO-2016143531 A1 | 9/2016 |
| WO | WO 2018/079296 | 5/2018 |
| WO | WO-2018150902 A1 | 8/2018 |
| WO | WO-2020012984 A1 | 1/2020 |

* cited by examiner

SOLID-STATE IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2021/000381, having an international filing date of 7 Jan. 2021, which designated the United States, which PCT application claimed the benefit of Japanese Patent Application No. 2020-038455, filed 6 Mar. 2020, the entire disclosures of each of which are incorporated herein by reference.

TECHNICAL FIELD

The present disclosure relates to a solid-state imaging device and an electronic device including the solid-state imaging device.

BACKGROUND ART

In recent years, a solid-state imaging device capable of simultaneously acquiring a color image and a near-infrared image has been known. In this solid-state imaging device, a photoelectric conversion unit (pixel) for visible light and a photoelectric conversion unit (pixel) for near-infrared light are formed on the same substrate (chip).

Since silicon (Si) constituting a substrate has a low absorption coefficient, near-infrared light is photoelectrically converted even at a deep depth from a light receiving surface made of Si as compared with visible light. Therefore, it is strongly requested to reflect near-infrared light that reaches a wiring layer to contribute to sensitivity.

Further, in the specification where Si is thin, since visible light reaches the wiring layer, it is also strongly requested to reflect the visible light to contribute to sensitivity.

Therefore, in recent years, a solid-state imaging device has been proposed in which various wiring layers provided on the lower layer side of the Si layer also function as a reflection mirror structure (for example, PTL 1).

CITATION LIST

Patent Literature

[PTL 1]
  JP 2016-001633 A

SUMMARY

Technical Problem

By the way, when the wiring layer is used as the reflection layer, the wiring layout is restricted.

When an antireflection portion (RIG) having a moth-eye structure for preventing the reflection of incident light is provided, for example, the near-infrared light is reflected by the RIG in the pixel for the near-infrared light, the reflected near-infrared light is reflected by the wiring layer and is likely to leak to adjacent pixels, and color mixing is likely to occur.

The present disclosure has been made in view of such circumstances, and an object thereof is to provide a solid-state imaging device and an electronic device capable of improving the sensitivity of near-infrared wavelengths and suppressing color mixing without being restricted by the wiring layout.

Solution to Problem

An aspect of the present disclosure provides a solid-state imaging device including: a substrate on which a plurality of photoelectric conversion units that photoelectrically convert incident light are formed corresponding to different light wavelengths; a wiring layer including a transistor laminated on a surface opposite to a surface on a light incident side of the substrate and positioned on a photoelectric conversion unit side so as to execute signal processing on a charge output from the photoelectric conversion unit and a wiring positioned on a side opposite to the photoelectric conversion unit side of the transistor so as to transfer an electrical signal obtained by the transistor; and a reflection design film which is formed on a transistor side from at least a junction between the substrate and the wiring layer, which has higher reflectivity than the wiring layer and reflects a vertical component of incident light.

Another aspect of the present disclosure provides an electronic device including a solid-state imaging device including: a substrate on which a plurality of photoelectric conversion units that photoelectrically convert incident light are formed corresponding to different light wavelengths; a wiring layer including a transistor laminated on a surface opposite to a surface on a light incident side of the substrate and positioned on a photoelectric conversion unit side so as to execute signal processing on a charge output from the photoelectric conversion unit and a wiring positioned on a side opposite to the photoelectric conversion unit side of the transistor so as to transfer an electrical signal obtained by the transistor; and a reflection design film which is formed on a transistor side from at least a junction between the substrate and the wiring layer, which has higher reflectivity than the wiring layer and reflects a vertical component of incident light.

DESCRIPTION OF EMBODIMENTS

Embodiments of the present disclosure will be described below with reference to the figures. In descriptions of the figures referring to in the following description, the same or similar portions will be denoted by the same or similar reference signs and redundant description will be omitted. However, it should be noted that the drawings are schematic, and the relationships between thicknesses and planar dimensions, ratios of thicknesses of respective devices and members, and the like are different from actual ones. Therefore, specific thicknesses and dimensions should be determined by considering the following descriptions. In addition, it goes without saying that the figures also include portions having different dimensional relationships and ratios from each other.

In addition, it is to be understood that definitions of directions such as upward and downward in the following description are merely definitions provided for the sake of brevity and are not intended to limit technical ideas of the present disclosure. For example, it is obvious that when an object is observed after being rotated by 90°, upward and downward are converted into and interpreted as leftward and rightward, and when an object is observed after being rotated by 180°, upward and downward are interpreted as being inverted.

The advantageous effects described in the present specification are merely exemplary and are not restrictive, and other advantageous effects may be produced.

First Embodiment

<Overall Configuration of Solid-State Imaging Device>

Figure 1:
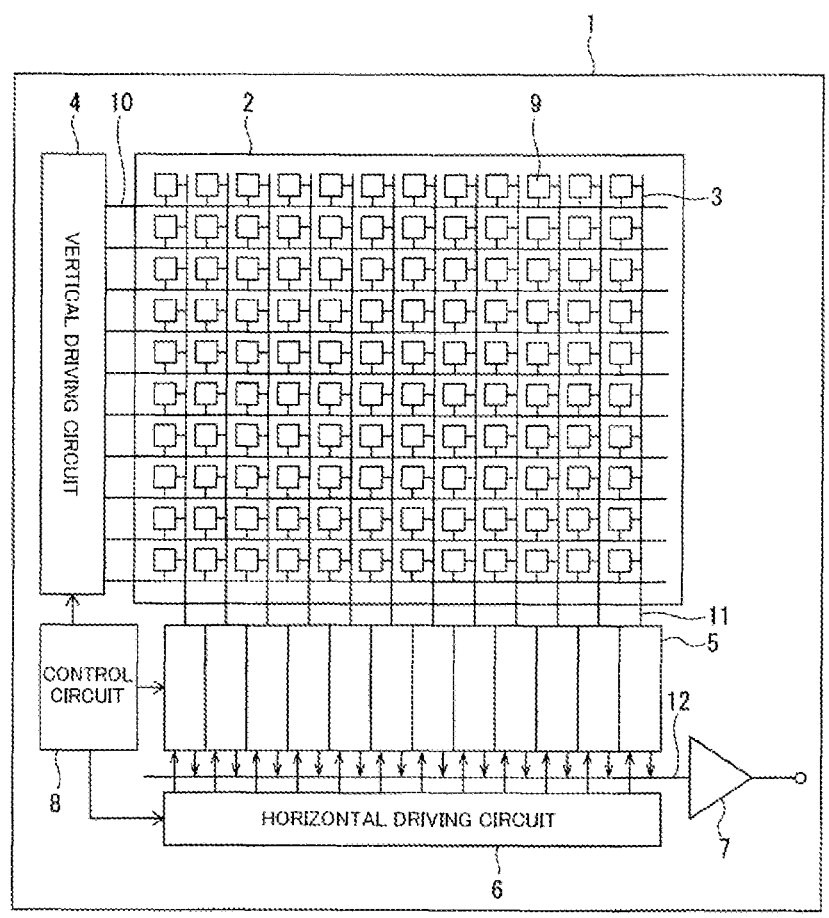
FIG. 1 is a schematic configuration diagram illustrating the entire solid-state imaging device 1 according to a first embodiment of the present disclosure.

The solid-state imaging device 1 according to the first embodiment of the present disclosure will be described. FIG. 1 is a schematic configuration diagram illustrating the entire solid-state imaging device 1 according to the first embodiment of the present disclosure.

The solid-state imaging device 1 in FIG. 1 is a backside irradiation type complementary metal oxide semiconductor (CMOS) image sensor. The solid-state imaging device 1 takes in image light from a subject through an optical lens, converts the light amount of the incident light formed on an imaging surface into electrical signals on a pixel-by-pixel basis, and outputs the electrical signals as pixel signals.

As illustrated in FIG. 1, the solid-state imaging device 1 according to the first embodiment includes a substrate 2, a pixel region 3, a vertical driving circuit 4, column signal processing circuits 5, a horizontal driving circuit 6, an output circuit 7, and a control circuit 8.

The pixel region 3 includes a plurality of pixels 9 arranged regularly in a two-dimensional array on the substrate 2. The pixel 9 includes photoelectric conversion units 20R, 20G, 20B, and 20IR shown in FIG. 2, and a plurality of pixel transistors (not shown). As the plurality of pixel transistors, for example, four transistors, that is, a transfer transistor, a reset transistor, a selecting transistor, and an amplifier transistor can be employed. In addition, for example, the three transistors except for the selecting transistor may be employed.

The vertical driving circuit 4, which is constituted by, for example, a shift register, selects a desired pixel driving wiring 10, supplies a pulse for driving the pixels 9 to the selected pixel driving wiring 10, and drives the pixels 9 in units of rows. That is, the vertical driving circuit 4 sequentially performs selection scanning on the pixels 9 in the pixel region 3 in a vertical direction in units of rows, and supplies a pixel signal based on signal charges generated in accordance with the amount of light received in the photoelectric conversion units 20R, 20G, 20B, and 20IR of each of the pixels 9 to the column signal processing circuit 5 through vertical signal lines 11.

The column signal processing circuit 5 is disposed, for example, for each column of the pixel 9, and performs signal processing such as noise removal for each pixel column on a signal which is output from the pixels 9 corresponding to one row. For example, the column signal processing circuit 5 performs signal processing such as correlated double sampling (CDS) and analog digital (AD) conversion for removing pixel-specific fixed pattern noise.

The horizontal driving circuit 6, which is constituted by, for example, a shift register, sequentially outputs a horizontal scanning pulse to the column signal processing circuits 5 to select each of the column signal processing circuits 5 in order, and outputs a pixel signal having been subjected to signal processing to the horizontal signal line 12 from each of the column signal processing circuits 5.

The output circuit 7 performs signal processing on pixel signals sequentially supplied and outputs the pixel signals through the horizontal signal line 12 from each of the column signal processing circuits 5. Examples of the signal processing which may be used include buffering, black level adjustment, array variation correction, various digital signal processing, and the like.

The control circuit 8 generates a clock signal or a control signal as a reference for operations of the vertical driving circuit 4, the column signal processing circuit 5, the horizontal driving circuit 6, and the like on the basis of a vertical synchronization signal, a horizontal synchronization signal, and a master clock signal. In addition, the control circuit 8 outputs the generated clock signal or control signal to the vertical driving circuit 4, the column signal processing circuit 5, the horizontal driving circuit 6, and the like.

Figure 2:
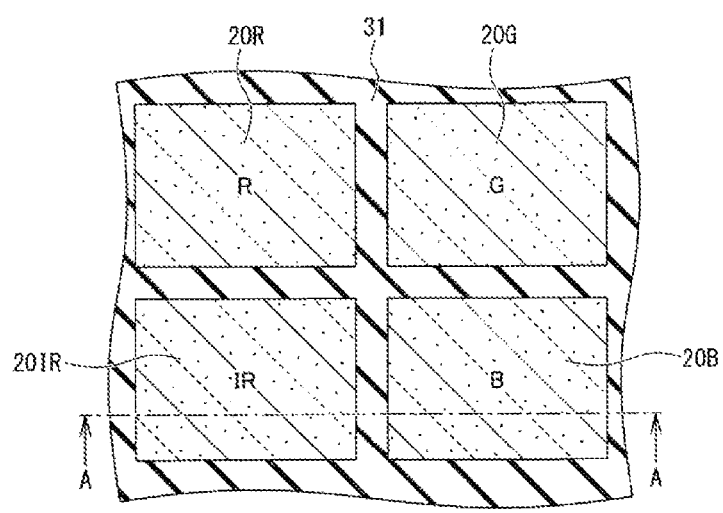
FIG. 2 is a cross-sectional diagram illustrating a configuration of a pixel region of the solid-state imaging device according to the first embodiment of the present disclosure.

FIG. 2 shows a plan view of the pixel region 3 of the solid-state imaging device 1 shown in FIG. 1. As shown in FIG. 2, a plurality of photoelectric conversion units 20R, 20G, 20B, and 20IR are arranged in a mosaic pattern. In FIG. 2, schematically, letter "R" designates the photoelectric conversion unit 20R for red, "B" designates the photoelectric conversion unit 20B for blue, "G" designates the photoelectric conversion unit 20G for green, and "IR" designates the photoelectric conversion unit 20IR for near-infrared light. The arrangement pattern of the photoelectric conversion units 20R, 20G, 20B, and 20IR is not limited to the case of FIG. 2, and various arrangement patterns can be adopted.

FIG. 2 illustrates a case where the photoelectric conversion units 20R, 20G, 20B, and 20IR are arranged at equal pitches in the row direction and the column direction. The photoelectric conversion units 20R, 20G, 20B, and 20IR are electrically separated by an element separation portion 31.

The element separation portion 31 is formed in a grid pattern so as to surround each photoelectric conversion unit 20R, 20G, 20B, and 20IR.

Figure 3:
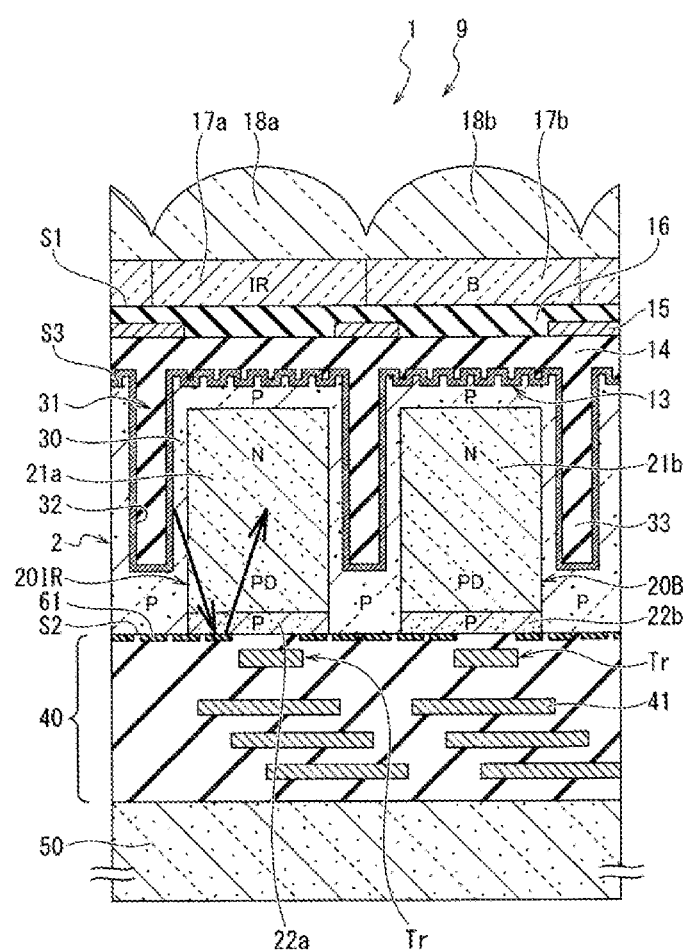
FIG. 3 is a cross-sectional view taken from the direction A-A of a cross-section obtained by vertically cutting a one-dot chain line passing through the photoelectric conversion unit of FIG. 2.

FIG. 3 shows a cross-sectional view taken from the direction A-A of a cross-section obtained by vertically cutting a one-dot chain line passing through the photoelectric conversion units 20IR and 20B of FIG. 2.

In FIG. 3, a backside-illumination type complementary metal oxide semiconductor (CMOS) image sensor is illustrated as the solid-state imaging device 1. Hereinafter, the surface of each member of the solid-state imaging device 1 on the light-incident surface side (upper side of FIG. 3) is referred to as a "back surface", and the surface of each member of the solid-state imaging device 1 on the side (lower side of FIG. 3) opposite to the light-incident surface side is referred to as a the "front surface".

As shown in FIG. 3, in the solid-state imaging device 1, the substrate 2, an antireflection portion (RIG) 13 having a moth-eye structure, an insulating film 14, a light shielding film 15, and a planarization film 16 are laminated in that order. A color filter 17a for near-infrared light, a color filter 17b for blue, and on-chip lenses 18a and 18b are laminated in that order on the back surface S1 of the planarization film 16. The wiring layer 40 and the supporting substrate 50 are laminated in that order on the front surface S2 of the substrate 2.

The photoelectric conversion units 20R, 20G, 20B, and 20IR (only the photoelectric conversion units 20B and 20IR are shown in FIG. 3) are formed on the substrate 2 of the solid-state imaging device 1. FIG. 3 illustrates a case where the photoelectric conversion unit 20IR for near-infrared light is adjacent to the photoelectric conversion unit 20B for blue.

As the substrate 2, for example, a semiconductor substrate made of silicon (Si) can be used. The photoelectric conversion unit 20IR has an n-type semiconductor region 21a and a p-type semiconductor region 22a formed on the front surface S2 side of the substrate 2, and the n-type semiconductor region 21a and the p-type semiconductor region 22a form a photodiode. The photoelectric conversion unit 20B has an n-type semiconductor region 21b and a p-type semiconductor region 22b formed on the front surface S2 side of the substrate 2, and the n-type semiconductor region 21b and the p-type semiconductor region 22b form a photodiode.

In the photoelectric conversion units 20IR and 20B, signal charges corresponding to the amount of incident light are generated, and the generated signal charges are accumulated in the n-type semiconductor regions 21a and 21b. The electrons that cause the dark current generated at the interface of the substrate 2 are absorbed by the holes that are the majority carriers of the p-type semiconductor regions 22a and 22b formed on the front surface S2 and the back surface S3 of the substrate 2 whereby the dark current is suppressed.

The photoelectric conversion units 20IR and 20B are electrically separated by a pixel separation layer 30 formed of a p-type semiconductor region and the element separation portion 31 formed in the pixel separation layer 30. As shown in FIG. 3, the element separation portion 31 has a groove portion 32 formed in the depth direction from the back surface S3 side of the substrate 2. That is, the groove portion 32 is formed by being engraved between the adjacent photoelectric conversion units 20IR and 20B on the back surface S3 side of the substrate 2. Similarly to the pixel separation layer 30 and the element separation portion 31, the groove portion 32 is formed in a grid pattern so as to surround each of the photoelectric conversion units 20R, 20G, 20IR, and 20B as shown in FIG. 2. An insulating film 33 for enhancing the light shielding performance against near-infrared light is embedded in the groove portion 32.

The antireflection portion (RIG) 13 prevents reflection of the incident light. The insulating film 14 continuously covers the entire back surface S3 of the substrate 2 so as to cover the RIG 13. The light shielding film 15 is formed in a grid pattern so as to open the light receiving surfaces of the photoelectric conversion units 20IR and 20B in a part of the back surface side (a part of the light receiving surface side) of the insulating film 14. The planarization film 16 continuously covers the entire back surface side of the insulating film 14 including the light shielding film 15. As a material of the planarization film 16, an organic material such as a resin can be used.

The on-chip lenses 18a and 18b collect the irradiation light, and cause the collected light to be efficiently incident on the photoelectric conversion units 20IR and 20B in the substrate 2 via the color filters 17a and 17b, respectively. The on-chip lenses 18a and 18b can be made of an insulating material that does not have light absorbing properties. Examples of the insulating material without light absorbing properties include a silicon oxide, a silicon nitride, a silicon oxynitride, an organic SOG, a polyimide-based resin, a fluorine-based resin, and the like.

The color filter 17a is formed corresponding to the wavelength of near-infrared light to be received by each pixel 9. The color filter 17a transmits light in the near-infrared wavelength, and causes the transmitted light to be incident on the photoelectric conversion unit 20IR in the substrate 2. The color filter 17b is formed corresponding to the wavelength of blue light to be received by each pixel 9. The color filter 17b transmits light in the blue light wavelength, and causes the transmitted light to be incident on the photoelectric conversion unit 20B in the substrate 2.

The wiring layer 40 is formed on the front surface S2 side of the substrate 2, and includes a pixel transistor Tr and a wiring 41 which are laminated in a plurality of layers. The pixel transistor Tr is arranged on the substrate 2 side. The wiring 41 is arranged on the front surface side of the pixel transistor Tr. A pixel transistor Tr constituting the pixels 9 is driven through the plurality of layers of wirings 41 formed in the wiring layer 40. For example, a silicon oxide (SiO) is used for the wiring layer 40.

The supporting substrate 50 is formed on a surface of the wiring layer 40 opposite to a side facing the substrate 2. The supporting substrate 50 is a substrate for securing the strength of the substrate 2 at a manufacturing stage of the solid-state imaging device 1. As a material of the supporting substrate 50, for example, silicon (Si) can be adopted.

In the solid-state imaging device 1 having the above configuration, light is irradiated from the back surface side of the substrate 2, the irradiated light is transmitted through the on-chip lenses 18a and 18b and the color filters 17a and 17b, and the transmitted light is photoelectrically converted by the photoelectric conversion units 20B and 20IR, whereby a signal charge is generated. Then, the generated signal charge is output as a pixel signal on the vertical signal line 11 shown in FIG. 1 formed by the wiring 41 via the pixel transistor Tr formed in the wiring layer 40.

Comparative Example

Since silicon (Si) constituting the substrate 2 has a low absorption coefficient, near-infrared light is photoelectrically converted even at a deep depth from the light receiving surface made of Si as compared with visible light. Therefore, as shown in FIG. 4, it is proposed to use the wiring 41 of the wiring layer 40 in order to reflect the light reaching the wiring layer 40 and contribute to the sensitivity.

Figure 4:
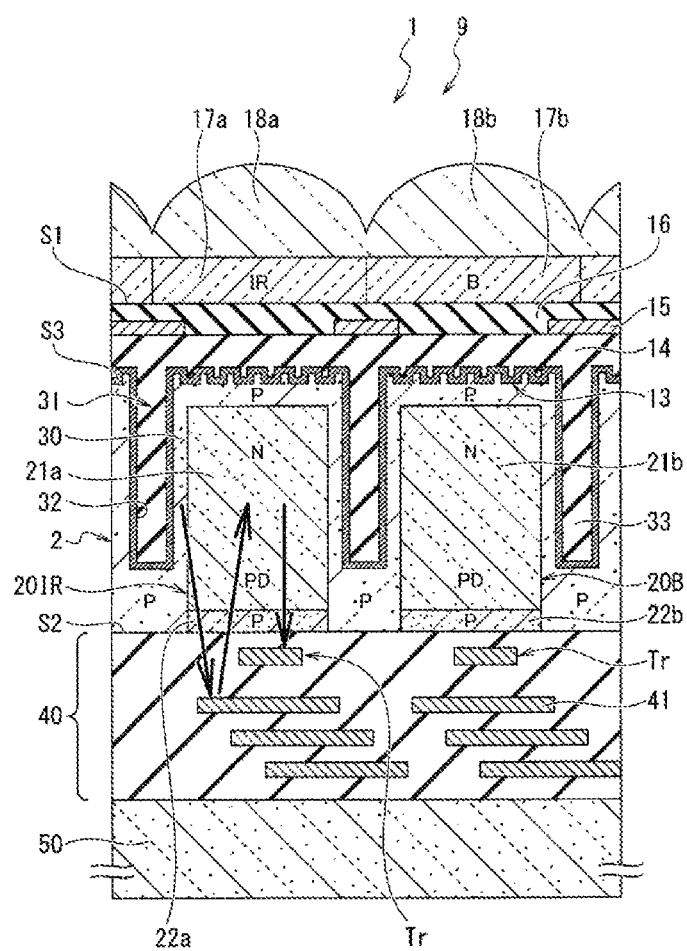
FIG. 4 is a cross-sectional view showing an example of a fixed imaging device in a comparative example.

FIG. 4 is a cross-sectional view showing an example of the solid-state imaging device 1 of a comparative example. In FIG. 4, the same parts as those in FIG. 3 are designated by the same reference numerals, and detailed description thereof will be omitted.

In the comparative example, when the wiring layer 40 is used as the reflection layer, the layout of the wiring 41 is restricted.

Figure 5:
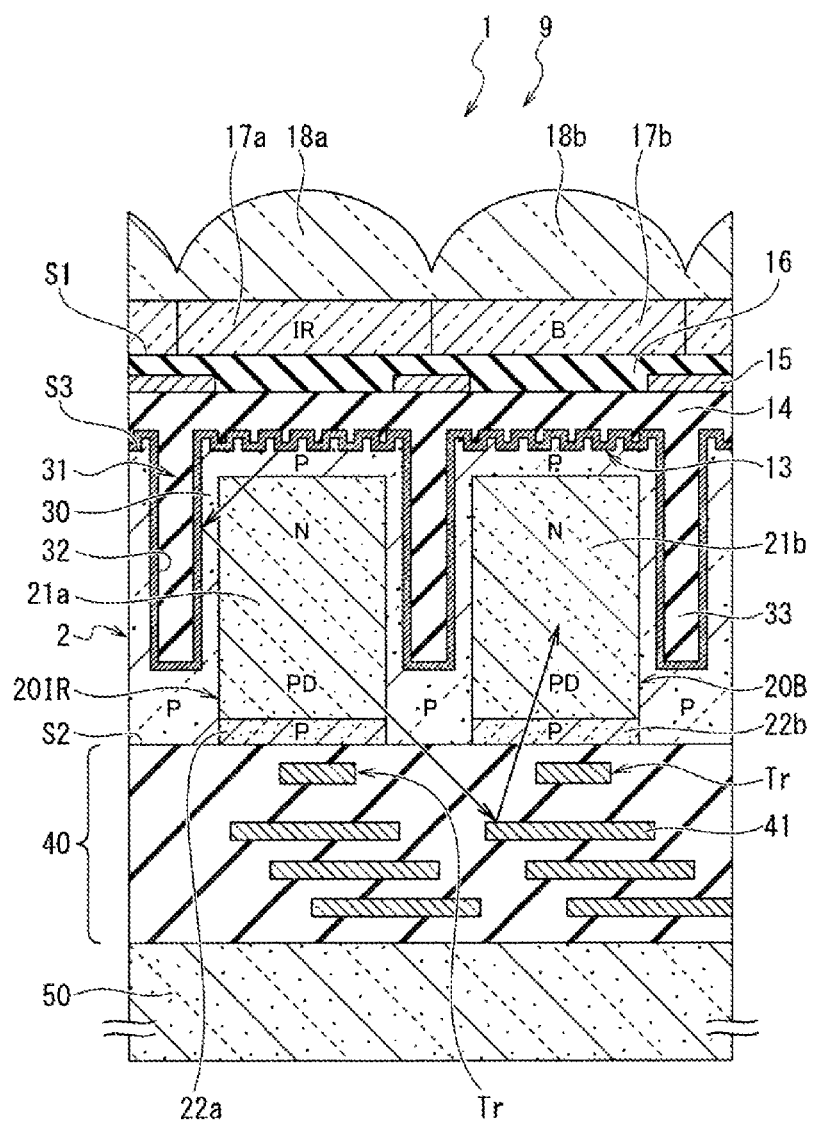
FIG. 5 is a cross-sectional view showing an example of a fixed imaging device in another comparative example.

Further, in the comparative example, as shown in FIG. 5, the near-infrared light diffracted and scattered by the RIG 13 is obliquely incident on the wiring 41 and enters the photoelectric conversion unit 20B for blue to cause color mixing.

Countermeasures in First Embodiment

Returning to FIG. 3, in the first embodiment of the present technology, a reflection design film 61 having higher reflectivity than the wiring layer 40 is formed at the junction between the substrate 2 and the wiring layer 40. For the reflection design film 61, a silicon nitride (SiN) or a silicon oxide (SiO) having a refractive index different from that of silicon (Si) is used instead of silicon (Si) used for the substrate 2. When a silicon oxide (SiO) is used for the wiring layer 40, it is preferable to use a silicon nitride (SiN) for the reflection design film 61. When a silicon nitride (SiN) is used for the wiring layer 40, it is preferable to use a silicon oxide (SiO) for the reflection design film 61.

Figure 6:
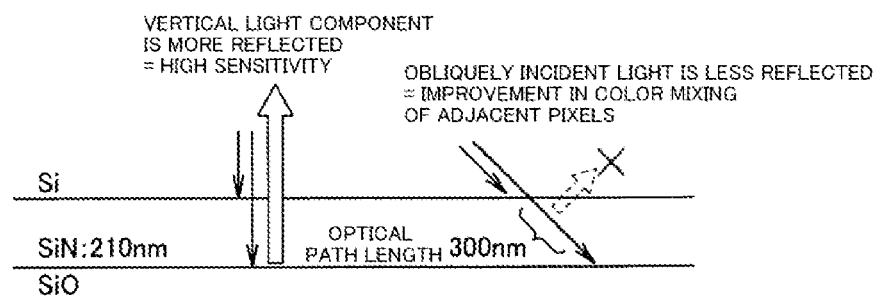
FIG. 6 is a diagram showing how incident light is reflected by a reflection design film in the solid-state imaging device according to the first embodiment of the present disclosure.

The reflection design film 61 is patterned at a position other than the position where the photoelectric conversion units 20B and 20IR and the pixel transistor Tr face each other. Further, as shown in FIG. 6, for example, in the case of the Si/SiN/SiO film configuration, when the wavelength of near-infrared light is $\lambda$, and the depth corresponding to the lamination direction from the substrate 2 to the wiring layer 40 is n, the strengthening thickness d of the reflection design film 61 is $2 \times \lambda/4n = 2 \times 850$ nm$/(4 \times 2.0)$, which is about 210 nm. Further, the weakening thickness of the reflection design film 61 is $3 \times 850$ nm$/(4 \times 2.0)$, which is about 300 nm.

Therefore, the reflection design film 61 more reflects the vertical component of the incident light, thereby contributing to the improvement in sensitivity to the incident near-infrared light and visible light without being restricted by the layout of the wiring 41.

Further, even if there is diffraction or scattering by the RIG 13, since the reflection design film 61 has low reflectivity to incident light from an oblique direction, color mixing of adjacent pixels can be suppressed.

Action and Effect According to First Embodiment

As described above, according to the first embodiment, the reflection design film 61 that has higher reflectivity than the wiring layer 40 and reflects the vertical component of the incident light is formed at the junction (Si interface) between the substrate 2 and the wiring layer 40 without using the wiring 41 in the wiring layer 40 as a reflection film. Thus, the amount of light incident on the photoelectric conversion units 20IR and 20B increases, which contributes to the improvement of sensitivity to near-infrared light and visible light without being restricted by the wiring layout. Further, even if there is diffraction or scattering by the RIG 13, since the reflection design film 61 has low reflectivity to incident light from an oblique direction, color mixing of adjacent pixels can be suppressed. Further, it is possible to design with priority on conversion efficiency without worrying about the use of reflection by the wiring 41.

Further, according to the first embodiment, the reflection design film 61 is formed at a position other than the position where the photoelectric conversion units 20IR and 20B and the pixel transistor Tr face each other. Thus, the wiring between the photoelectric conversion units 20IR and 20B and the pixel transistor Tr can be secured.

Further, according to the first embodiment, the semiconductor device includes the element separation portion 31 that insulates and separates between the adjacent photoelectric conversion units 20IR and 20B, and the RIG 13 that prevents reflection of incident light is provided on each of the photoelectric conversion units 20IR and 20B. Thus, the light shielding performance against near-infrared light can be enhanced in the photoelectric conversion unit 20IR for near-infrared light. Moreover, leakage of light from the photoelectric conversion unit 20IR for near-infrared light via the element separation portion 31 can be suppressed, which contributes to improvement in sensitivity to near-infrared light.

Second Embodiment

Next, a second embodiment will be described. The second embodiment is a modification of the first embodiment, and describes a case where the reflection design film is further formed on the surface of the wiring layer 40 and between the pixel transistor and the wiring 41 in the wiring layer 40.

Figure 7:
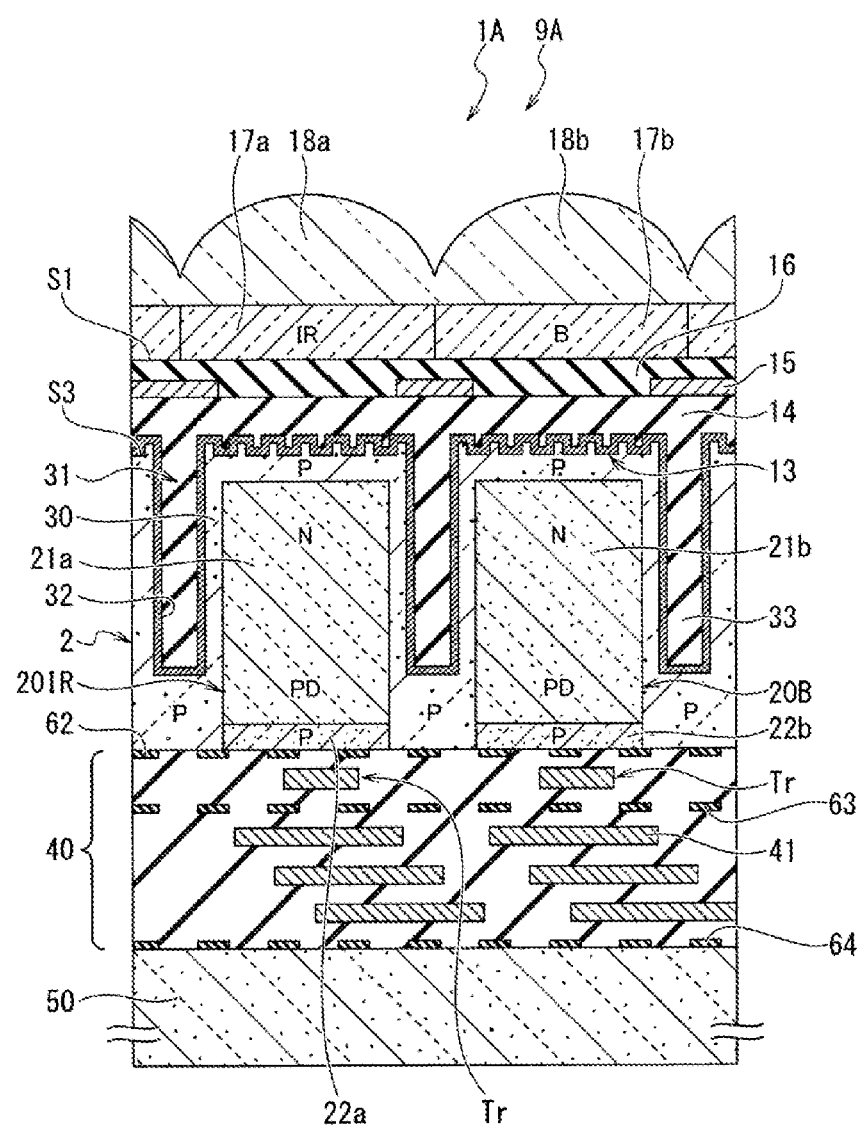
FIG. 7 is a cross-sectional view of a solid-state imaging device according to a second embodiment of the present disclosure, taken from the direction A-A of a cross-section obtained by vertically cutting a one-dot chain line passing through the photoelectric conversion unit of FIG. 2.

FIG. 7 shows a cross-sectional view of a solid-state imaging device 1A according to the second embodiment, taken from the direction A-A of a cross-section obtained by vertically cutting a one-dot chain line passing through the photoelectric conversion units 20IR and 20B of FIG. 2. In FIG. 7, the same parts as those in FIG. 3 are designated by the same reference numerals, and detailed description thereof will be omitted.

As shown in FIG. 7, the pixel 9A of the solid-state imaging device 1A forms a reflection design film 62 without patterning at the junction between the substrate 2 and the wiring layer 40. The pixel 9A of the solid-state imaging device 1A forms a reflection design film 63 between the pixel transistor Tr and the wiring 41. The pixel 9A of the solid-state imaging device 1A forms a reflection design film 64 on the surface of the wiring layer 40.

Figure 8:
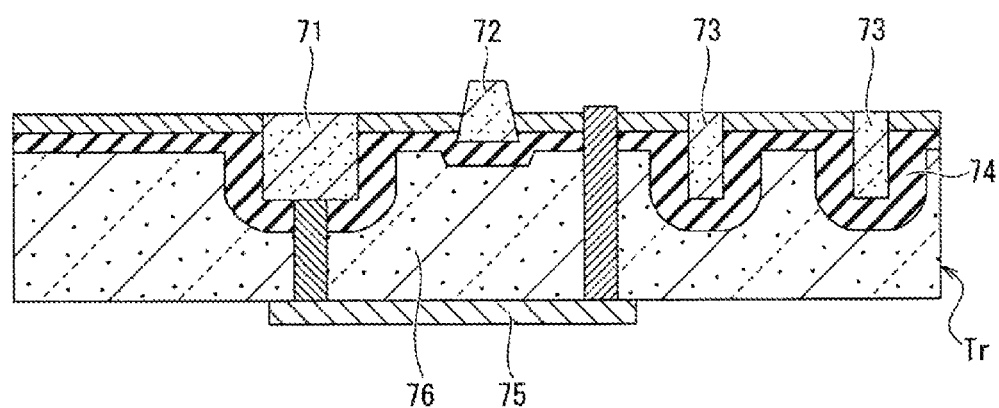
FIG. 8 is a cross-sectional view in which a reflection design layer is formed on a pixel transistor in the second embodiment of the present disclosure.

As shown in FIG. 8, the pixel transistor Tr is composed of a gate electrode 71, a drain region 72, and a source region 73. The gate electrode 71, the drain region 72, and the source region 73 are covered with an insulating film 74. A wiring portion 75 from the gate electrode 71 is connected between the drain region 72 and the source region 73. The wiring 41 is electrically connected to the source region 73. The photoelectric conversion units 20IR and 20B are electrically connected to the gate electrode 71.

That is, when a potential is applied from the photoelectric conversion units 20IR and 20B to the gate electrode 71, the pixel transistor Tr makes the drain region 72 and the source region 73 conductive and transmits a pixel signal via the wiring 41. For example, tungsten having high light shielding properties is used for the wiring portion 75. For example, a silicon oxide is used for the insulating film 74. The reflection design layer 76 is formed by, for example, embedding a silicon nitride between the insulating film 74 and the wiring portion 75.

Therefore, the reflection design layer 76 more reflects the vertical component of the light leaking from the reflection design film 62, thereby contributing to the improvement in sensitivity to the incident near-infrared light and visible light without being restricted by the layout of the wiring 41.

Action and Effect According to Second Embodiment

As described above, according to the second embodiment, the reflection design film 62 is formed at the junction between the substrate 2 and the wiring layer 40, the reflection design film 63 is also formed between the pixel transistor Tr and the wiring 41, and the reflection design film 64 is formed on the surface of the wiring layer 40. Thus, the vertical component of the light leaking from the reflection design film 62 formed at the junction between the substrate 2 and the wiring layer 40 can be reflected to the photoelectric conversion units 20IR and 20B by the reflection design film 63 formed between the pixel transistor Tr and the wiring 41 or the reflection design film 64 on the surface of the wiring layer 40, which contributes to further improvement in sensitivity to the incident near-infrared light and visible light.

Further, according to the second embodiment, the pixel transistor Tr can also be used as the reflection design film.

Third Embodiment

Next, a third embodiment will be described. The third embodiment is a modification of the first embodiment, and describes a case where the RIG is replaced with a flat antireflection portion and the reflection design film is removed only under the element separation portion.

Figure 9:
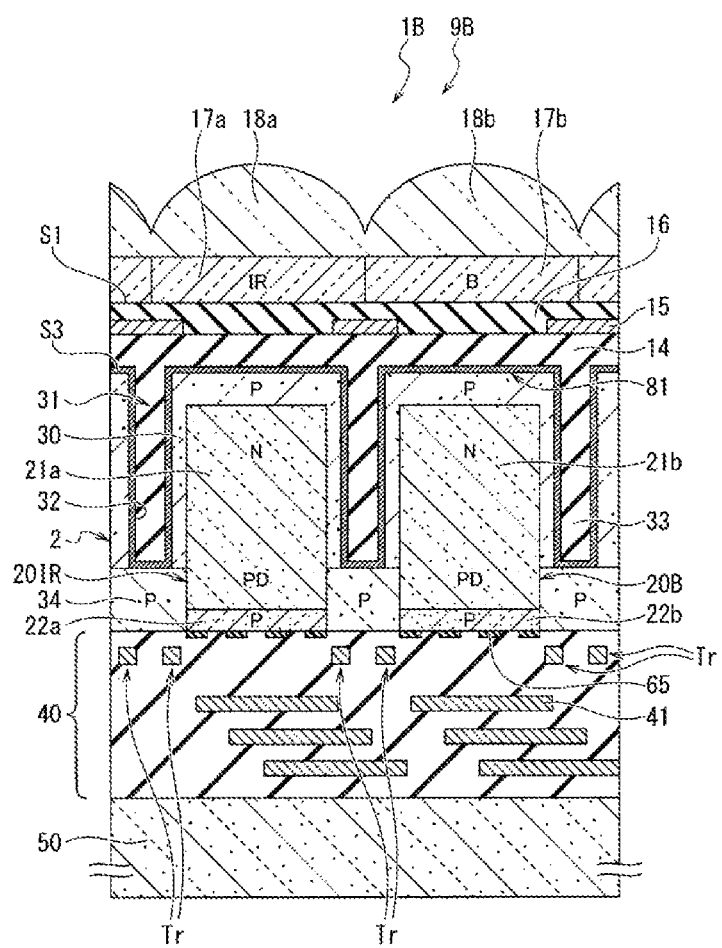
FIG. 9 is a cross-sectional view of a solid-state imaging device according to a third embodiment of the present disclosure, taken from the direction A-A of a cross-section obtained by vertically cutting a one-dot chain line passing through the photoelectric conversion unit of FIG. 2.

FIG. 9 shows a cross-sectional view of a solid-state imaging device 1B according to the third embodiment, taken from the direction A-A of a cross-section obtained by vertically cutting a one-dot chain line passing through the photoelectric conversion units 20IR and 20B of FIG. 2. In FIG. 9, the same parts as those in FIG. 3 are designated by the same reference numerals, and detailed description thereof will be omitted.

As shown in FIG. 9, the pixel 9B of the solid-state imaging device 1B forms a reflection design film 65 at the junction between the substrate 2 and the wiring layer 40. The pixel 9B of the solid-state imaging device 1B is provided with a flat antireflection portion 81 instead of the RIG 13 to prevent reflection of the incident light.

The reflection design film 65 is patterned at a position other than the position where the element separation portion 31 and the wiring layer 40 face each other. A p-well region 34 is formed under each element separation portion 31. A floating diffusion portion is formed in the p-well region 34. The signal charges photoelectrically converted by the photoelectric conversion units 20B and 20IR are accumulated in the floating diffusion portion.

In the wiring layer 40, a pixel transistor Tr is arranged under each element separation portion 31. Here, since the reflection design film 65 is removed between the floating diffusion portion and the pixel transistor Tr, the wiring between the floating diffusion portion and the pixel transistor Tr is secured.

In the solid-state imaging device 1B having the above configuration, light is irradiated from the back surface side of the substrate 2, the irradiated light is transmitted through the on-chip lenses 18*a* and 18*b* and the color filters 17*a* and 17*b*, and the transmitted light is photoelectrically converted by the photoelectric conversion units 20B and 20IR, whereby a signal charge is generated. Then, the generated signal charge is accumulated in the floating diffusion portion. The signal charge accumulated in the floating diffusion portion is output as a pixel signal on the vertical signal line 11 shown in FIG. 1 formed by the wiring 41 via the pixel transistor Tr formed in the wiring layer 40.

Action and Effect According to Third Embodiment

As described above, even in the third embodiment, the same action and effect as in the first embodiment can be obtained.

Modification Example of Third Embodiment

As a modification of the third embodiment, the on-chip lens 18*a* for near-infrared light may be formed by an on-chip lens having a high refractive index. In this case, a silicon nitride or an aluminum oxide is used.

Other Embodiments

While the present technique has been described above in the form of the first to third embodiments and the modification example of the third embodiment, it is not to be understood that the descriptions and drawings that constitute parts of the disclosure limit the present technique. When the purpose of the technical content disclosed by the first to third embodiments is understood, it will be clear for a person skilled in the art that various alternative embodiments, examples, and operable techniques are included in the present technique. In addition, the configurations disclosed in the first to third embodiments and the modification example of the third embodiment can be appropriately combined within a range where there is no contradiction. For example, configurations disclosed in a plurality of different embodiments may be combined, or configurations disclosed in a plurality of different modifications of the same embodiment may be combined.

Application Example to Electronic Device

Figure 10:
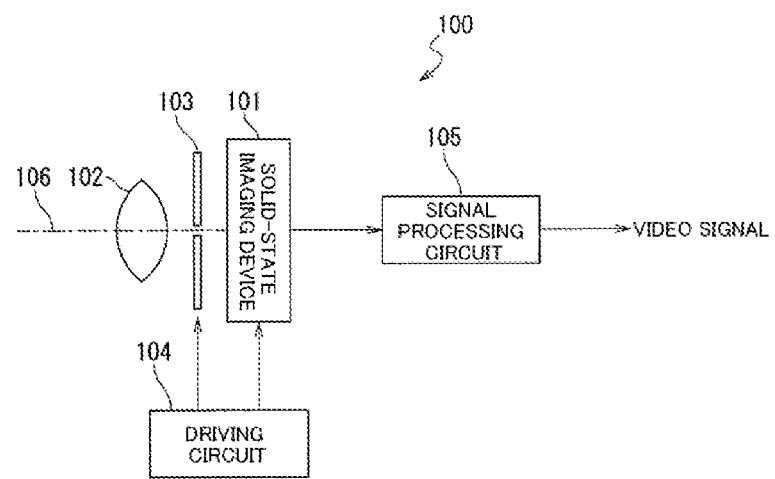
FIG. 10 is a schematic diagram of an electronic device according to a fourth embodiment of the present disclosure.

Next, an electronic device according to a fourth embodiment of the present disclosure will be described. FIG. 10 is a schematic configuration diagram of the electronic device 100 according to the fourth embodiment of the present disclosure. The electronic device 100 according to the fourth embodiment includes a solid-state imaging device 101, an optical lens 102, a shutter device 103, a driving circuit 104, and a signal processing circuit 105. In the electronic device 100 according to the third embodiment, an embodiment in a case where the solid-state imaging device 1 according to the first embodiment of the present disclosure is used for electronic device (for example, a camera) is shown as the solid-state imaging device 101.

The optical lens 102 forms an image of image light (incident light 106) from a subject on an imaging surface of the solid-state imaging device 101. Thereby, signal charges are accumulated in the solid-state imaging device 101 for a certain period. The shutter device 103 controls a light irradiation period and a light shielding period for the solid-state imaging device 101. The driving circuit 104 supplies a driving signal for controlling a transfer operation of the solid-state imaging device 101 and a shutter operation of the shutter device 103. Signal transfer of the solid-state imaging device 101 is performed by the drive signal (timing signal) supplied from the driving circuit 104. The signal processing circuit 105 performs various signal processing on signals (pixel signals) output from the solid-state imaging device 101. An image signal having been subjected to signal processing is stored in a storage medium such as a memory or is output to a monitor.

With such a configuration, in the electronic device 100 of the fourth embodiment, the optical color mixing is suppressed in the solid-state imaging device 101, so that the image quality of the video signal can be improved.

Note that the electronic device 100 to which the solid-state imaging device 1, 1A, or 1B can be applied is not limited to a camera, and the solid-state imaging device 1 can also be applied to other electronic device. The solid-state imaging device 1 may be applied to an imaging device such as a camera module for mobile device such as a mobile phone.

Further, in the fourth embodiment, a configuration in which the solid-state imaging devices 1, 1A, and 1B according to the first to third embodiments are used in an electronic device has been adopted as the solid-state imaging device 101, but other configurations may be adopted.

In addition, the present disclosure can also adopt the following configurations.

(1) A solid-state imaging device comprising: a substrate on which a plurality of photoelectric conversion units that photoelectrically convert incident light are formed corresponding to different light wavelengths; a wiring layer including a transistor laminated on a surface opposite to a surface on a light incident side of the substrate and positioned on a photoelectric conversion unit side so as to execute signal processing on a charge output from the photoelectric conversion unit and a wiring positioned on a side opposite to the photoelectric conversion unit side of the transistor so as to transfer an electrical signal obtained by the transistor; and a reflection design film which is formed on a transistor side from at least a junction between the substrate and the wiring layer, which has higher reflectivity than the wiring layer and reflects a vertical component of incident light.

(2) The solid-state imaging device according to (1), wherein the reflection design film is formed at a position other than a position where the photoelectric conversion unit and the transistor face each other.

(3) The solid-state imaging device according to (1) or (2), wherein the reflection design film is further formed at least between the transistor and the wiring or on a surface of the wiring layer opposite to the junction with the substrate.

(4) The solid-state imaging device according to any one of (1) to (3), wherein the substrate includes an element separation portion that insulates and separates between the plurality of adjacent photoelectric conversion units.

(5) The solid-state imaging device according to any one of (1) to (4), wherein the substrate includes an antireflection portion having a moth-eye structure that prevents reflection of the incident light.

(6) The solid-state imaging device according to any one of (1) to (5), wherein the reflection design film has a film thickness of $d=2\times\lambda/4n$, where $\lambda$ is a wavelength of near-infrared light and n is a corresponding depth in a lamination direction from the substrate to the wiring layer.

(7) The solid-state imaging device according to any one of (1) to (6), wherein the reflection design film is formed on the transistor.

(8) The solid-state imaging device according to (4), wherein the reflection design film is formed at a position other than a position where the element separation portion and the wiring layer face each other.

(9) The solid-state imaging device according to any one of (1) to (8), wherein the reflection design film is a silicon nitride or a silicon oxide.

(10) An electronic device comprising a solid-state imaging device including: a substrate on which a plurality of photoelectric conversion units that photoelectrically convert incident light are formed corresponding to different light wavelengths; a wiring layer including a transistor laminated on a surface opposite to a surface on a light incident side of the substrate and positioned on a photoelectric conversion unit side so as to execute signal processing on a charge output from the photoelectric conversion unit and a wiring positioned on a side opposite to the photoelectric conversion unit side of the transistor so as to transfer an electrical signal obtained by the transistor; and a reflection design film which is formed on a transistor side from at least a junction between the substrate and the wiring layer, which has higher reflectivity than the wiring layer and reflects a vertical component of incident light.

REFERENCE SIGNS LIST 1, 1A, 1B Solid-state imaging device
2 Substrate
3 Pixel region
4 Vertical driving circuit
5 Column signal processing circuit
6 Horizontal driving circuit
7 Output circuit
8 Control circuit
9, 9A, 9B Pixel
10 Pixel driving wiring
11 Vertical signal line
12 Horizontal signal line
13 Antireflection portion (RIG) of moth-eye structure
14, 33, 74 Insulating film
15 Light shielding film
16 Planarization film
17a, 17b Color filter
18a, 18b On-chip lens
20R, 20G, 20B, 20IR Photoelectric conversion unit
21a, 21b n-type semiconductor region
22a, 22b p-type semiconductor region
30 Pixel separation layer
31 Element separation portion
32 Groove portion
34 p-well region
40 Wiring layer
41 Wiring
50 Supporting substrate
61, 62, 63, 64, 65 Reflection design film
71 Gate electrode
72 Drain region
73 Source region
75 Wiring portion
76 Reflection design layer
81 Antireflection portion
100 Electronic device
101 Solid-state imaging device
102 Optical lens
103 Shutter device
104 Driving circuit
105 Signal processing circuit
106 Incident light
Tr Pixel transistor

What is claimed is:

1. A solid-state imaging device, comprising:
a substrate on which a plurality of photoelectric conversion units that photoelectrically convert incident light are formed corresponding to different light wavelengths;
a wiring layer including a transistor laminated on a surface opposite to a surface on a light incident side of the substrate and positioned on a photoelectric conversion unit side so as to execute signal processing on a charge output from the photoelectric conversion unit and a wiring positioned on a side opposite to the photoelectric conversion unit side of the transistor so as to transfer an electrical signal obtained by the transistor; and
a reflection design film which is formed on a transistor side from at least a junction between the substrate and the wiring layer, which has higher reflectivity than the wiring layer and reflects a vertical component of incident light,
wherein the reflection design film is further formed between the transistor and the wiring and on a surface of the wiring layer opposite to the junction with the substrate.

2. The solid-state imaging device according to claim 1, wherein the reflection design film is formed at a position other than a position where the photoelectric conversion unit and the transistor face each other.

3. The solid-state imaging device according to claim 1, wherein the substrate includes an element separation portion that insulates and separates between adjacent photoelectric conversion units.

4. The solid-state imaging device according to claim 1, wherein the substrate includes an antireflection portion having a moth-eye structure that prevents reflection of the incident light.

5. The solid-state imaging device according to claim 1, wherein the reflection design film is further formed on the transistor.

6. The solid-state imaging device according to claim 3, wherein the reflection design film is formed at a position other than a position where the element separation portion and the wiring layer face each other.

7. The solid-state imaging device according to claim 1, wherein the reflection design film is a silicon nitride or a silicon oxide.

8. An electronic device, comprising:
an optical system;
a solid-state imaging device that receives light from the optical system, the solid-state imaging device including:
    a substrate on which a plurality of photoelectric conversion units that photoelectrically convert incident light are formed corresponding to different light wavelengths;
    a wiring layer including a transistor laminated on a surface opposite to a surface on a light incident side of the substrate and positioned on a photoelectric conversion unit side so as to execute signal processing on a charge output from the photoelectric conversion unit and a wiring positioned on a side opposite to the photoelectric conversion unit side of the transistor so as to transfer an electrical signal obtained by the transistor; and
    a reflection design film which is formed on a transistor side from at least a junction between the substrate and the wiring layer, which has higher reflectivity than the wiring layer and reflects a vertical component of incident light,
    wherein the reflection design film is further formed between the transistor and the wiring and on a surface of the wiring layer opposite to the junction with the substrate; and
a signal processing circuit that processes signals received from the solid-state imaging device.

9. The electronic device according to claim 8, wherein the reflection design film is formed at a position other than a position where the photoelectric conversion unit and the transistor face each other.

10. The electronic device according to claim 8, wherein the substrate includes an element separation portion that insulates and separates between adjacent photoelectric conversion units.

11. The electronic device according to claim 8, wherein the substrate includes an antireflection portion having a moth-eye structure that prevents reflection of the incident light.

12. The electronic device according to claim 8, wherein the reflection design film is further formed on the transistor.

13. The electronic device according to claim 10, wherein the reflection design film is formed at a position other than a position where the element separation portion and the wiring layer face each other.

14. The electronic device according to claim 8, wherein the reflection design film is a silicon nitride or a silicon oxide.

15. The electronic device according to claim 8, wherein the wiring includes tungsten.

16. The electronic device according to claim 8, wherein the plurality of photoelectric conversion units are arranged in a mosaic pattern.

17. The solid-state imaging device according to claim 1, wherein the wiring includes tungsten.

18. The solid-state imaging device according to claim 1, wherein the plurality of photoelectric conversion units are arranged in a mosaic pattern.

19. The solid-state imaging device according to claim 1, wherein the plurality of photoelectric conversion units are arranged in equal pitches in a row direction and a column direction.

* * * * *